United States Patent
Smith (10) Patent No.: US 6,977,412 B2
(45) Date of Patent: Dec. 20, 2005

(54) TRENCH CORNER EFFECT BIDIRECTIONAL FLASH MEMORY CELL

(75) Inventor: Michael Smith, Boise, ID (US)

(73) Assignee: Micron Technology, Inc., Boise, ID (US)

(*) Notice: Subject to any disclaimer, the term of this patent is extended or adjusted under 35 U.S.C. 154(b) by 22 days.

(21) Appl. No.: 10/656,636

(22) Filed: Sep. 5, 2003

(65) Prior Publication Data

US 2005/0051830 A1 Mar. 10, 2005

(51) Int. Cl.[7] .............................................. H01L 29/792
(52) U.S. Cl. ...................................................... 257/324
(58) Field of Search ................................. 257/314–324; 438/251–265

(56) References Cited

U.S. PATENT DOCUMENTS

| | | |
|---|---|---|
| 4,184,207 A | 1/1980 | McElroy |
| 4,420,504 A | 12/1983 | Cooper |
| 4,755,864 A | 7/1988 | Ariizumi |
| 4,794,091 A | 12/1988 | Lynch |
| 4,881,114 A | 11/1989 | Mohsen |
| 4,890,144 A | 12/1989 | Teng |
| 5,109,259 A | 4/1992 | Banerjee |
| 5,241,496 A | 8/1993 | Lowrey |
| 5,330,930 A | 7/1994 | Chi |
| 5,378,647 A | 1/1995 | Hong |
| 5,379,253 A | 1/1995 | Bergemont |
| 5,397,725 A | 3/1995 | Wolstenholme |
| 5,467,305 A | 11/1995 | Bertin |
| 5,576,236 A | 11/1996 | Chang |
| 5,768,192 A | 6/1998 | Eitan |
| 5,792,697 A | 8/1998 | Wen |
| 5,858,841 A | 1/1999 | Hsu |
| 5,911,106 A | 6/1999 | Tasaka |
| 5,946,558 A | 8/1999 | Hsu |
| 5,966,603 A | 10/1999 | Eitan |
| 5,994,745 A | 11/1999 | Hong |
| 6,011,725 A | 1/2000 | Eitan |
| 6,028,342 A | 2/2000 | Chang |
| 6,030,871 A | 2/2000 | Eitan |

(Continued)

FOREIGN PATENT DOCUMENTS

| | | |
|---|---|---|
| EP | 84303740.9 | 1/1985 |
| EP | 90115805.5 | 2/1991 |
| EP | 01113179.4 | 12/2002 |

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556–558, Copyright 2001 IEEE.

B. Eitan et al., "Spatial Characterization of Hot Carriers Injected into the Gate Dielectric Stack of a MOFSET Based on Non-Volatile Memory Device," date unknown, pp. 58–60.

(Continued)

Primary Examiner—Cuong Nguyen
(74) Attorney, Agent, or Firm—Leffert Jay & Polglaze, P.A.

(57) ABSTRACT

A non-volatile memory cell structure that is capable of holding two data bits. The structure includes a trench in a substrate with two sides of the trench being lined with a trapping material. The trench is filled with an oxide dielectric material and a control gate is formed over the oxide-filled trench. Source/drain regions are adjacent the trench sides with the trapping material. An energy barrier between the drain and source regions has two local high points that correspond to the trench corners. To read the device, sufficient gate voltage is applied to invert the channel and a sufficient drain voltage is applied to pull down the drain-side barrier. If charges of opposite polarity are trapped in the source-side trench corner, the source barrier will be significantly lowered so that current flows between source and drain under read conditions.

19 Claims, 4 Drawing Sheets

U.S. PATENT DOCUMENTS

| | | | |
|---|---|---|---|
| 6,044,022 A | 3/2000 | Nachumovsky | |
| 6,081,456 A | 6/2000 | Dadashev | |
| 6,108,240 A | 8/2000 | Lavi | |
| 6,133,102 A | 10/2000 | Wu | |
| 6,134,156 A | 10/2000 | Eitan | |
| 6,147,904 A | 11/2000 | Liron | |
| 6,157,570 A | 12/2000 | Nachumovsky | |
| 6,172,396 B1 | 1/2001 | Chang | |
| 6,174,758 B1 | 1/2001 | Nachumovsky | |
| 6,175,523 B1 | 1/2001 | Yang | |
| 6,181,597 B1 | 1/2001 | Nachumovsky | |
| 6,184,089 B1 | 2/2001 | Chang | |
| 6,201,282 B1 | 3/2001 | Eitan | |
| 6,201,737 B1 | 3/2001 | Hollmer | |
| 6,204,529 B1 | 3/2001 | Lung | |
| 6,207,504 B1 | 3/2001 | Hsieh | |
| 6,208,557 B1 | 3/2001 | Bergemont | |
| 6,215,702 B1 | 4/2001 | Derhacobian | |
| 6,218,695 B1 | 4/2001 | Nachumovsky | |
| 6,222,768 B1 | 4/2001 | Hollmer | |
| 6,240,020 B1 | 5/2001 | Yang | |
| 6,243,300 B1 | 6/2001 | Sunkavalli | |
| 6,251,731 B1 | 6/2001 | Wu | |
| 6,255,166 B1 | 7/2001 | Ogura | |
| 6,256,231 B1 | 7/2001 | Lavi | |
| 6,266,281 B1 | 7/2001 | Derhacobian | |
| 6,269,023 B1 | 7/2001 | Derhacobian | |
| 6,272,043 B1 | 8/2001 | Hollmer | |
| 6,275,414 B1 | 8/2001 | Randolph | |
| 6,282,118 B1 | 8/2001 | Lung | |
| 6,291,854 B1 | 9/2001 | Peng | |
| 6,297,096 B1 | 10/2001 | Boaz | |
| 6,303,436 B1 | 10/2001 | Sung | |
| 6,327,174 B1 | 12/2001 | Jung | |
| 6,348,711 B1 | 2/2002 | Eitan | |
| 6,392,930 B2 | 5/2002 | Jung | |
| 6,417,053 B1 | 7/2002 | Kuo | |
| 6,421,275 B1 | 7/2002 | Chen | |
| 6,429,063 B1 | 8/2002 | Eitan | |
| 6,432,778 B1 | 8/2002 | Lai | |
| 6,461,949 B1 | 10/2002 | Chang | |
| 6,468,864 B1 | 10/2002 | Sung | |
| 6,469,342 B1 | 10/2002 | Kuo | |
| 6,477,084 B1 | 11/2002 | Eitan | |
| 6,486,028 B1 | 11/2002 | Chang | |
| 6,487,050 B1 | 11/2002 | Liu | |
| 6,498,377 B1 | 12/2002 | Lin | |
| 6,514,831 B1 | 2/2003 | Liu | |
| 6,531,887 B2 | 3/2003 | Sun | |
| 6,545,309 B1 | 4/2003 | Kuo | |
| 6,552,387 B1 | 4/2003 | Eitan | |
| 6,555,866 B1 | 4/2003 | Kuo | |
| 6,559,013 B1 | 5/2003 | Pan | |
| 6,576,511 B2 | 6/2003 | Pan | |
| 6,580,135 B2 | 6/2003 | Chen | |
| 6,580,630 B1 | 6/2003 | Liu | |
| 6,583,479 B1 | 6/2003 | Fastow | |
| 6,602,805 B2 | 8/2003 | Chang | |
| 6,607,957 B1 | 8/2003 | Fan | |
| 6,610,586 B1 | 8/2003 | Liu | |
| 6,613,632 B2 | 9/2003 | Liu | |
| 6,617,204 B2 | 9/2003 | Sung | |
| 6,627,943 B2 | 9/2003 | Shin | |
| 6,693,010 B1 | 2/2004 | Mirgorodski | |
| 6,713,336 B2 | 3/2004 | Shin | |
| 6,713,345 B1 | 3/2004 | Kang | |
| 6,754,105 B1 * | 6/2004 | Chang et al. | 257/324 |
| 2001/0001075 A1 | 5/2001 | Ngo | |
| 2001/0004332 A1 | 6/2001 | Eitan | |
| 2001/0011755 A1 | 8/2001 | Tasaka | |
| 2002/0024092 A1 | 2/2002 | Palm | |
| 2002/0142569 A1 | 10/2002 | Chang | |
| 2002/0146885 A1 | 10/2002 | Chen | |
| 2002/0151138 A1 | 10/2002 | Liu | |
| 2002/0177275 A1 | 11/2002 | Liu | |
| 2002/0182829 A1 | 12/2002 | Chen | |
| 2003/0015752 A1 | 1/2003 | Palm | |
| 2003/0057997 A1 | 3/2003 | Sun | |
| 2003/0067807 A1 | 4/2003 | Lin | |
| 2003/0082876 A1 | 5/2003 | Mandelman | |
| 2003/0117861 A1 | 6/2003 | Maayan | |

OTHER PUBLICATIONS

B. Eitan et al., "NROM: A Novel Localized Trapping, 2–Bit Nonvolatile Memory Cell," IEEE Electron Device Lett, vol. 21, No. 11, (Nov. 2000), pp. 543–545, Copyright 2000 IEEE.

E. Maayan et al., "A 521Mb NROM Flash Data Storage Memory with 8MB/s Data Range," Dig. IEEE Int. Solid–State Circuits Conf., San Francisco, (Feb. 2002), pp. 1–8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non–Volatile Memories, 6.1 and 6.2, pp. 76–77, 407–408. Copyright 1990 IEEE.

M. Janai, "Data Retention, Endurance and Acceleration Factors of NROM Devices," IEEE $41^{st}$ Annual International Reliability Physics Symposium, Dallas, TX (2003), pp. 502–505, Copyright 1989 IEEE.

S. Minami and Y. Kamigaki, "A Novel MONOS Novolatile Memory Device Ensuring 10–Year Data Retention after $10^7$ Erase/Write Cycles," IEEE Transactions on Electron Devices, vol. 40, No. 11 (Nov. 1993) pp. 2011–2017, Copyright 1998 IEEE.

C. Pan, K. Wu, P. Freiberger, A. Chatterjee, G. Sery, "A Scaling Methodology for Oxide–Nitride–Oxide Interpoly Dielectric for EPROM Applications," IEEE Transactions on Electron Devices, vol. 37, No. 6, (Jun. 1990), pp. 1439–1443, Copyright 1990 IEEE.

P. Manos and C. Hart, "A Self–Aligned EPROM Structure with Superior Data Retention," IEEE Electron Device Letters, vol. 11, No. 7, (Jul. 1990) pp. 309–311, Copyright 1990 IEEE.

W. Owen and W. Tchon, "$E^2$PROM Product Issues and Technology Trends," IEEE 1989, pp. 17–19, Copryright 1989 IEEE.

T. Huang, F. Jong, T. Chao, H. Lin, L. Leu, K. Young, C. Lin, K. Chiu, "Improving Radiation Hardness of EEPROM/Flash Cell BY $N_2O$ Annealing," IEEE Electron Device Letters, vol. 19, No. 7 (Jul. 1998), pp. 256–258, Copyright 1998 IEEE.

B. Eitan et al., "Electrons Retention Model for Localized Charge in Oxide—Nitride–Oxide (ONO) Dielectric," IEEE Device Lett., vol. 23, No. 9, (Sep. 2002), pp. 556–558. Copyright 2002 IEEE.

T. Nozaki, T. Tanaka, Y. Kijiya, E. Kinoshita, T. Tsuchiya, Y. Hayashi, "A 1–Mb EEPROM with MONOS Memory Cell for Semiconductor Disk Application," IEEE Journal of Solid–State Circuits, vol. 26, No. 4 (Apr. 1991), pp. 497–501, Copyright 1991 IEEE.

F. Vollebregt, R. Cuppens, F. Druyts, G. Lemmen, F. Verberne, J. Solo, "A New E(E)PROM Technology With a $TiSi_2$ Control Gate," IEEE 1989, pp. 25.8.1–25.8.4. Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939–1946, Copyright 2002 IEEE.

B. Eitan et al., "Spatial characterization of Channel hot electron injection utilizing subthreshold slope of the localized charge storage NROM™ memory device" Non–Volatile Semiconductor Memory Workshop (NVSMW), Monterey, CA, (Aug. 2001), pp. 1–2.

B. Eitan et al., "Can NROM, a 2–bit, Trapping Storage NVM Cell, Give a Real Challenge to Floating Gate Cells?" Int. Conf. on Solid State Devices and Materials, Tokyo, (1999), pp. 1–3, Copyright 1999 Saifun Semiconductors Ltd.

S. Ogura, et al. "Twin MONOS Cell with Dual Control Gates," Halo LSI and New Halo, pp 187–187.3, Date Unknown.

T. Sugizaki, et al. "New 2–bit/Tr MONOS Type Flash Memory using $Al_2O_3$ as Charge Trapping Layer," Fujitsu Laboratories Ltd, Date Unknown.

T. Saito, et al. "Hot Hole Erase Characteristics and Reliability in Twin MONOS Device" Halo LSI, Date Unknown.

Saifun Semiconductors, LTD. PowerPoint Presentation, Date Unknown.

Y. Roizin, et al. "Novel Techniques for data retention and Leff measurements in two bit MicroFlash® Memory Cells," Characterization and Metrology for ULSI Tecnology: 200 International Conf., pp. 181–185, Copyright 2001 American Institute of Physics, 1–56396–967–X/01.

W.J. Tsai, et al. "Cause of Data Retention Loss in a Nitride–Based Localized Trapping Storage Flash Memory Cell," IEEE 40th Annual International Reliability Physics Symposium, Dallas, (2002), pp. 34–38. Copyright 2002 IEEE.

W.J. Tsai, et al. "Data Retention Behavior of a SONOS Type Two–Bit Storage Flash Memory Cell," IEDM 01–0179–01–722, Copyright 2001 IEEE.

A. Shappir, et al., "Subtreshold slope degradation model for localized–charge–trapping based non–volatile memory devices," Solid–State Electronics 47 (2003), pp. 937–941. Copyright 2003 Elsevier Science Ltd.

R. Neale, "AMD's MirrorBit—a big step in Flash progress," Electronic Engineering Design, V. 74, No. 906, pp. 47–50.

I. Bloom, et al., "NROM™—a new technology for non–volatile memory products" Solid–State Electronics 46 (2002), pp. 1757–1763. Copyright 2002 Elsevier Science Ltd.

J. Bu and M. White, "Electrical characterization on ONO triple dielectric on SONOS nonvolatile memory devices," Solid–State Electroncis 45 (2001) pp. 47–51. copyright 2001 Elsevier Science Ltd.

Y. Kamigaki and S. Minami, "MNOS Nonvolatile Semiconductor Memory Technology: Present and Future," IEICE Trans. Electron, vol. E84–C, No. 6, pp. 713–723 (Jun. 2001).

E. Lusky, et al., "Electron Discharge Model of Locally–Trapped Charge in Oxide–Nitride–Oxide (ONO) Gates for NROM™ Non–Volatile Semiconductor Memory Devices," Extended Abstracts of the 2001 International Conference on Solid State Devices and Materials, Tokyo, 2001 pp. 534–535.

A. Nughin, "n–Channel 256kb and 1Mb EEPROMs," ISSCC91, Session 134, Special Session on Technology in the USSR, Paper 13.4, 1991 IEEE International Solid State Circuits Conference, Digest of Technical Papers, pp. 228–229, 319.

G. Xue, et al., "Low Voltage Low Cost Nitride Embedded Flash Memory Cell" IMEC., Date Unknown.

L. Breuil, et al., "A new 2 isolated–bits/cell flash memory device with self aligned split gate structure using ONO stacks for charge storage," IMEC, Date Unknown.

J. Willer, et al., "UMEM: A U–shape Non–Volatile–Memory Cell," Ingentix GmbH &Co. KG., Infineon Technologies and Saifun Semiconductors, Date Unknown.

S. Kang, et al., "A Study of SONOS Nonvolatile Memory Cell Controlled Structurally by Localizing Charge–Trapping Layer," Samsung Electrons Co., Ltd., Date Unknown.

Y. Roizin, et al., "In–Process Charging in microFLASH® Memory Cells," Tower Semiconductor, Ltd., Date Unknown.

A. Shappir, et al., "Subthreshold slope degradation model for localized–charge–trapping based non–volatile memory devices," Solid State Electronics, 47 (2003) pp. 937–941, copyright 2003 Elsevier Science Ltd.

I. Fujiwara, et al., "High speed program/erase sub 100 nm MONOS memory cell," Sony Corporation, Date Unknown.

E.. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1–2., Date Unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao–Tung University, Date Unknown.

Y. K. Lee, et al., "30–nm Twin Silicon–Oxide–Nitride–Oxide–Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non–Volatile Memory for the Embedded SoC Solution," 2003 Symposium on VLSI Technology Digest of Technical Papers, pp. 31–32.

Y. Hayashi, et al., "Twin MONOS Cell with Dual Control Gates," 2000 Symposium on VLSI Technology Digest of Technical Papers, 2000 IEEE, pp. 122–123.

M. K. Cho and D. M. Kim, "High Performance SONOS Memory Cells Free of Drain Turn–On and Over–Erase: Compatibility Issue with Current Flash Technology," IEEE Electron Device Letters, vol. 21, No. 8, Aug. 2000, pp. 399–401, Copyright 2000 IEEE.

T. Y. Chan, K.K. Young and C. Hu, "A True Single–Transistor Oxide–Nitride–Oxide EEPROM Device," IEEE Electron Devices Letters, vol. EDL–8, No. 3, Mar. 1987, pp. 93–95., Copyright 1987 IEEE.

I. Bloom, et al., "NROM™ NVM technology for Multi–Media Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2–Sided Hot Hole Injection Erase," Motorola Embedded Memory Center, Date Unknown.

Y. Roizin, et al., "Retention Characteristics of *micro*FLASH® Memory (Activation Energy of Traps in the ONO Stack)," Tower Semiconductor, Ltd., Date Unknown.

Y. Roizin, et al., "Activation Energy of Traps in the ONO Stack of *micro*FLASH® Memory Cells," Tower Semiconductor, Ltd., Date Unknown.

Y. Roizin, et al., "Dummy' Gox for Optimization of *micro*FLASH® Technology," Tower Semiconductor, Ltd., Date Unknown.

Y. K. Lee, et al., "Multi–Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., Date Unknown.

J. Bu, et al., "Retention Reliability Enhanced SONOS NVSM with Scaled Programming Voltage," Microelectronics Lab., Date Unknown.

H. Tomiye, et al., "A novel 2–bit/cell MONOS memory device with a wrapped–control–gate structure that applies source–side hot–electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147–148.

* cited by examiner

TRENCH CORNER EFFECT BIDIRECTIONAL FLASH MEMORY CELL

TECHNICAL FIELD OF THE INVENTION

The present invention relates generally to memory cells and in particular the present invention relates to structures of non-volatile memory cells.

BACKGROUND OF THE INVENTION

In order for memory manufacturers to remain competitive, memory designers must constantly increase the density of flash memory devices. Increasing the density of a flash memory device generally requires reducing spacing between memory cells. It is becoming increasingly difficult to further reduce spacing between memory cells. Closer packing also generally requires smaller dimensions of device elements.

Smaller dimensions of many device elements may cause operational problems with the cell. For example, the channel between the source/drain regions becomes shorter possibly causing severe short channel effects. Additionally, smaller size cells with a continuous layer of oxide-nitride-oxide (ONO) may have a problem with charge migrating from one bit-storage point to the other.

For the reasons stated above, and for other reasons stated below which will become apparent to those skilled in the art upon reading and understanding the present specification, there is a need in the art for smaller non-volatile memory cells without the disadvantages inherent in the smaller cells.

SUMMARY

The above-mentioned problems with increasing memory density and other problems are addressed by the present invention and will be understood by reading and studying the following specification.

The present invention encompasses a trench corner effect, bidirectional flash memory cell. The cell comprises a trench formed in a silicon substrate. A trapping material is deposited on the corners of at least two sides of the trench. The trench is filled with an oxide material. A plurality of active areas are located on the silicon substrate. The active areas are substantially adjacent to an opening of the trench and substantially adjacent to the trench sides having the trapping material. A control gate is located above the trench. In one embodiment, the control gate partially overlaps each of the active areas.

Further embodiments of the invention include methods and apparatus of varying scope.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer or substrate, used in the following description, include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1:
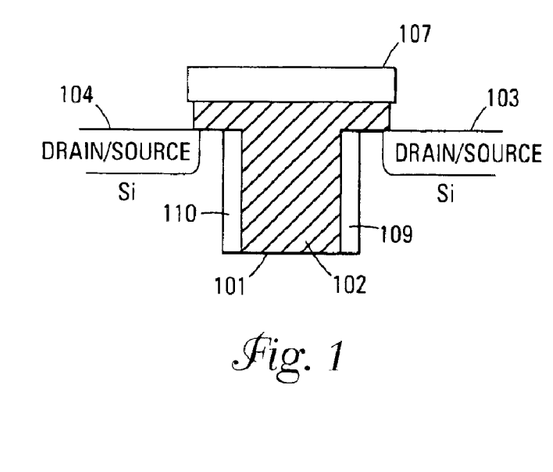
FIG. 1 shows a cut-away view of one embodiment for a trench corner effect bidirectional flash memory cell of the present invention.

FIG. 1 illustrates a cut-away view of the structure of the of the trench corner effect, bidirectional flash memory cell of the present invention. The cell can be created as either a p-channel device or an n-channel device. The n-channel device provides for hole trapping while the p-channel device involves electron trapping.

The cell is comprised of a trench 101 that is oxide 102 filled. In alternate embodiments, the trench is filled with other low-trap-density dielectric materials.

On either side of the trench 101 are drain/source regions 103 and 104. These are either n+ or p+ regions, depending on the type of device as discussed previously. In one embodiment, the trench extends to a depth at least that of the drain/source regions 103 and 104. Since the memory cell of the present invention is a symmetrical device, the drain/source regions 103 and 104 are interchangeable. The applied voltage determines which side is the drain and which is the source. Therefore, the subsequent discussion of these areas does not limit the present invention to any one configuration of drain and source regions.

Trapping layers 109 and 110 are formed on either side of the trench 101. These layers 109 and 110 are electrically isolated sections so that there is no migration of charges from one trapping layer 109 or 110 to the other 110 or 109. As will be discussed subsequently, a data bit can be stored in each corner of the trench in its respective trapping layer 109 or 110.

In one embodiment, the trapping layers 109 and 110 are formed as substantially uniform layers covering entire opposing sidewalls of the trench. There is no trapping material across the bottom of the trench 101. In an alternate embodiment, there is at most minimal trapping material across the bottom of the trench so that the two trapping layers 109 and 110 remain isolated from each other. In another alternate embodiment, the trapping layers 109 and 110 may be formed as a continuous layer of trapping material.

Figure 8:
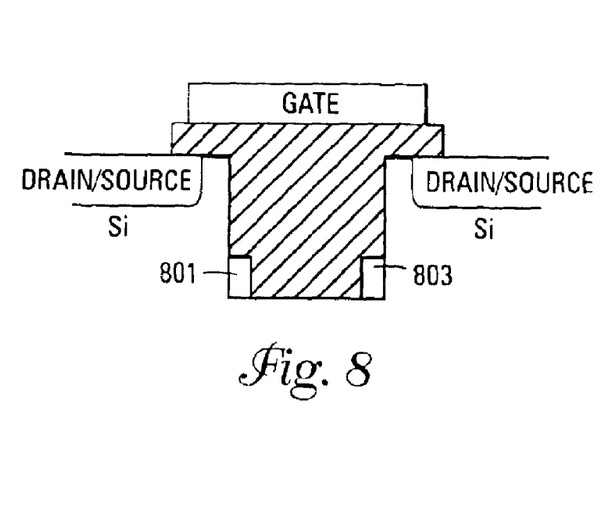
FIG. 8 shows an alternate embodiment trapping layer configuration of the embodiment of FIG. 1.

FIG. 8 illustrates another embodiment of the trapping layers. In this embodiment, the trapping layers 801 and 803 are formed only in the trench corners since this is where the charge build-up occurs.

Referring again to FIG. 1, the type of trapping material 109 and 110 depends on the type of cell. For example, a p-channel device might use an Oxide-Nitride-Oxide (ONO) structure. An n-channel device might use a different trapping structure. The present invention is not limited to any one type of trapping structure.

A control gate 107 of the cell of FIG. 1 is formed over the oxide-filled trench 101 and overlaps the drain/source regions 103 and 104. Alternate embodiments for forming the gate structure are discussed subsequently.

Figure 2:
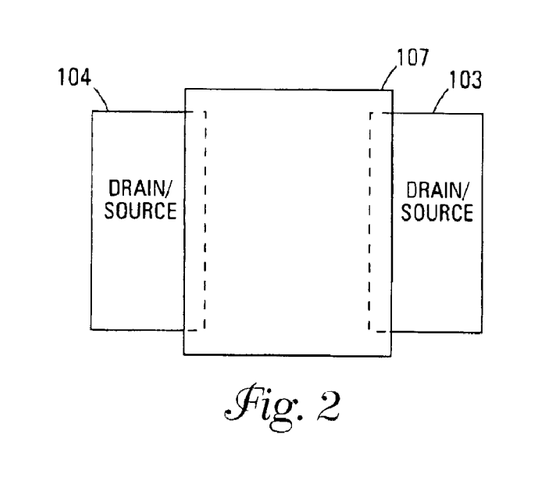
FIG. 2 shows a top view of the trench corner effect bidirectional flash memory cell of FIG. 1.

FIG. 2 illustrates a top view of the trench corner effect, bidirectional flash memory cell of FIG. 1. This view shows the gate structure 107 overlapping the two drain/source regions 103 and 104.

Figure 3:
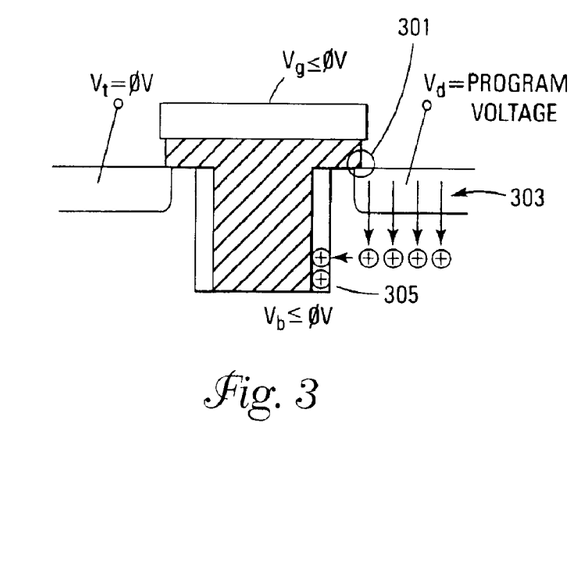
FIG. 3 shows one embodiment of the theory of operation of the trench corner effect bidirectional flash memory cell of FIG. 1 during a programming operation.

FIG. 3 illustrates one embodiment of the theory of operation, during a programming operation, of the trench corner effect bidirectional flash memory cell of FIG. 1. In this embodiment, the substrate ($V_b$) is biased at less than 0V, the gate voltage $V_g$ is 0V (or less than 0V) and the source voltage $V_s$ is also 0V. The drain voltage $V_d$ is biased at a typical programming voltage. In one embodiment, this voltage is in a range of 6.0–8.5V. These voltages are for purposes of illustration only. The present invention is not limited to any one set of voltages.

When a sufficiently high voltage is applied to the drain region, junction 301 breakdown occurs. The resulting charges are accelerated 303 towards the substrate due to the drain-to-substrate voltage. Some of the charges that are accelerated towards the substrate are redirected and trapped in the oxide near the silicon-oxide interface along the side of the trench. In one embodiment, the trapping occurs at or near the trench corner 305 in the trapping layer. This trapped charge, being opposite in polarity to the channel-type, lowers the drain-side energy barrier. The drain voltage further eliminates the drain-side energy barrier. Even though this is typically not a desirable effect for an isolation trench, it is utilized in the memory cell of the present invention as described subsequently with reference to FIGS. 4–7.

FIGS. 4–7 illustrate plots of silicon-oxide interface potential versus distance across the cell. The silicon-oxide interface potential along the y-axis, increasing from bottom to top. The distance across the x-axis of the cell is typically measured in microns and increases from left to right. The plot's corresponding cell with its trench and active areas is not shown for purposes of clarity but the elements of the cell are indicated by the voltage indicators (i.e., $V_s$, $V_g$, and $V_d$).

Figure 4A:
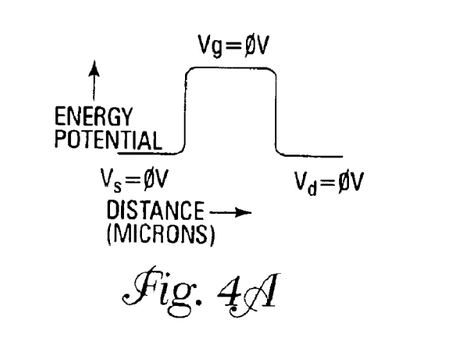
FIGS. 4A and B show plots of silicon-oxide interface potential versus distance along the cell having no bias and a gate bias only.

FIG. 4A illustrates a plot of silicon-oxide interface potential versus distance for a cell without a gate voltage applied. Both $V_s$ and $V_d$ are 0V as well. The corner affect is not yet evident since there is no gate voltage to perturb the interface potential.

Figure 4B:
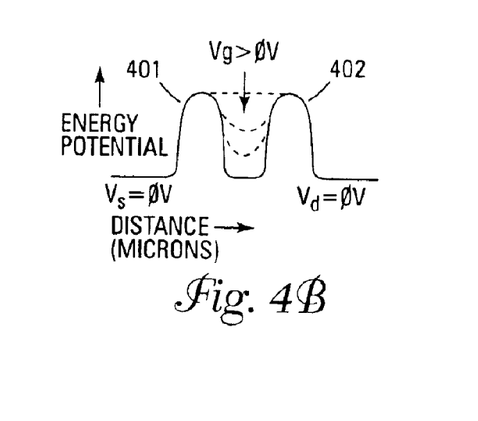

FIG. 4B illustrates the same plot as $V_g$ is increased. The dotted lines indicating the change in the silicon-oxide interface potential as $V_g$ increases. The top dotted line is where $V_g$=0. As $V_g$ increases from 0, it begins to perturb the potential. In one embodiment, when $V_g$=14V, the two corner energy barriers 401 and 402 are fully evident and current flow is unaffected by the center region of the cell. This embodiment shows that $V_s$ and $V_d$ are both 0V and the corner energy barriers 401 and 402 are not affected.

Figure 5A:
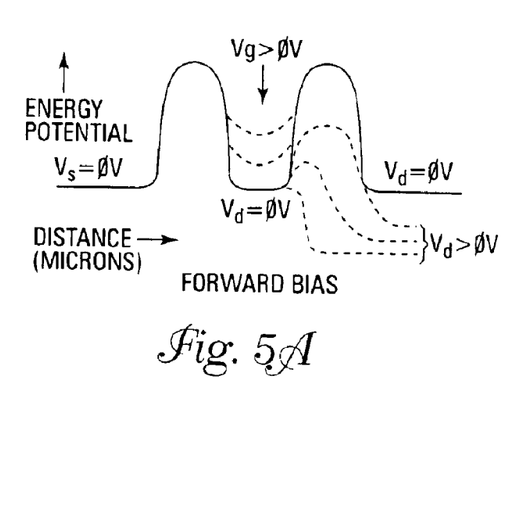
FIGS. 5A and B show plots of silicon-oxide potential versus distance along the cell with a drain/source bias applied simultaneously with a gate bias.
Figure 5B:
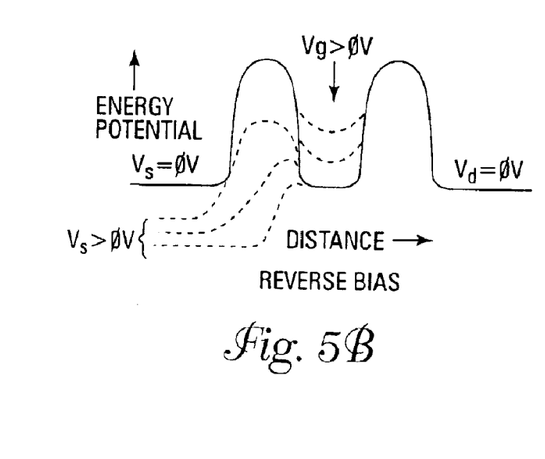

FIGS. 5A and B illustrate forward and reverse bias plots of silicon-oxide interface potential versus distance for a cell with an initial drain/source bias simultaneously with a gate bias. FIG. 5A shows the forward bias plot of the drain bias applied simultaneously with the gate bias. As the drain bias is increased, the drain energy barrier is pulled down further. FIG. 5B shows the reverse bias plot of the source bias applied simultaneously with the gate bias. As the source bias is increased, the source energy barrier is pulled down further.

In both forward and reverse bias cases, illustrated in FIG. 5, the barrier closest to the drain/source is pulled down but the opposite barrier remains high since charges have not been trapped. This prevents current from flowing along the channel and neither bit can be read.

Figure 6A:
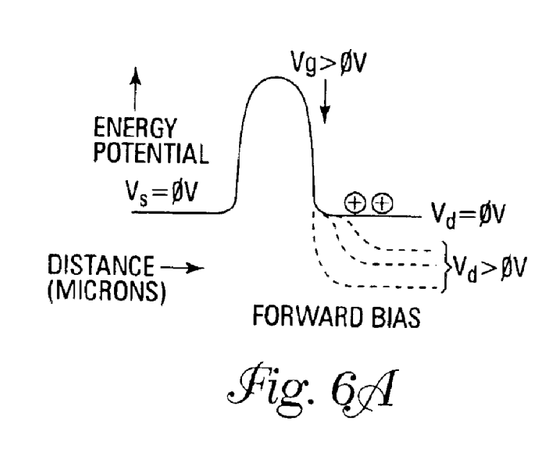
FIGS. 6A and B show plots of silicon-oxide interface potential versus distance along the cell with a drain/source bias applied simultaneously with a gate bias and trapping has occurred.
Figure 6B:
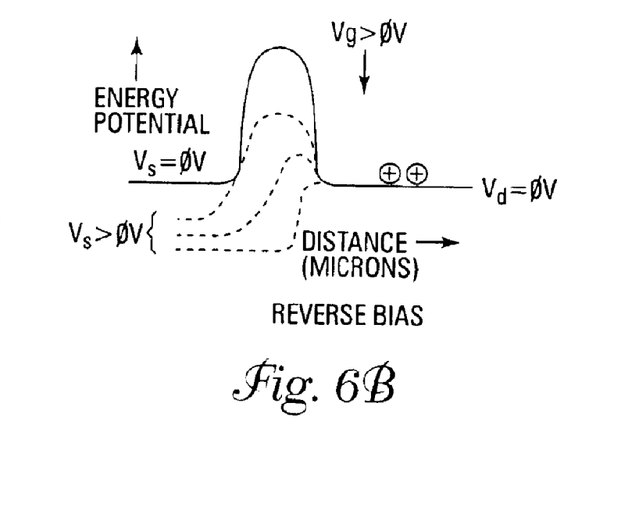

FIGS. 6A and B illustrate forward and reverse bias plots of silicon-oxide interface potential versus distance along the cell with a drain/source bias applied simultaneously with a gate bias and trapping has occurred. FIG. 6A illustrates the forward biased condition with a sufficient drain voltage applied, simultaneously with a gate voltage, to eliminate the drain-side energy barrier. In this case, no current flows due to the source-side energy barrier remaining high and blocking current.

FIG. 6B illustrates the reverse biased condition with the source-side energy barrier pulled down by a sufficient source voltage. In this case, the drain-side energy barrier is eliminated by the trapped charge. Therefore, drain-side stress results in reverse current only.

Figure 7:
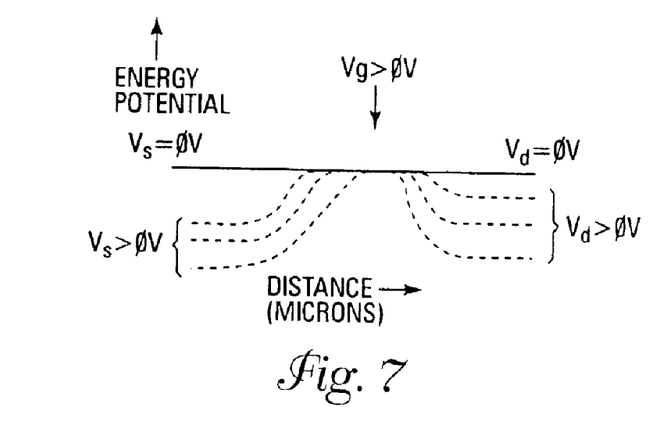
FIG. 7 shows a plot of silicon-oxide interface potential versus distance along the cell with a drain and source bias applied to reduce both the drain-side and source-side energy barriers.

FIG. 7 illustrates a plot of silicon-oxide interface potential versus distance along the cell when a charge is trapped in both corners. The device will conduct in either direction, depending on which end is biased.

In the above embodiments of FIGS. 4–7, a sufficient drain/source voltage to pull down the respective energy barrier to allow current to flow may be in the range of 6.0V to 8.5V. Alternate embodiments use other voltage ranges to obtain substantially similar results, depending on the type of memory device. It should be noted that the reverse current may saturate at a predetermined source voltage in each of the above cases.

The trench corner effect bidirectional flash memory cell could be programmed and erased using methods substantially similar to parasitic field devices. Programming (charge trapping) could be accomplished by junction breakdown as described above. The effect can be accelerated by applying a substrate voltage or a negative $V_g$ bias for an n-channel device.

Reading the memory cell could be performed by applying a gate voltage sufficient to invert the trench bottom center as shown in FIGS. 6–7. A voltage is also applied to the drain that pulls down the drain-side barrier. Current would then flow depending on whether there is a trapped charge present at the source-side barrier.

Erasing the memory cell could be accomplished in multiple ways. One erase method would be to tunnel the charge out of the trapping layer into the substrate by applying a voltage between the gate and the substrate/drain/source so as to produce a high electric field in the trapping material.

A second erasing method includes using hot-carrier effects by pulling significant channel current such that a charge of the opposite polarity as the trapped charge would be injected into the trapping material and compensate/combine with the trapped charge.

Figure 9:
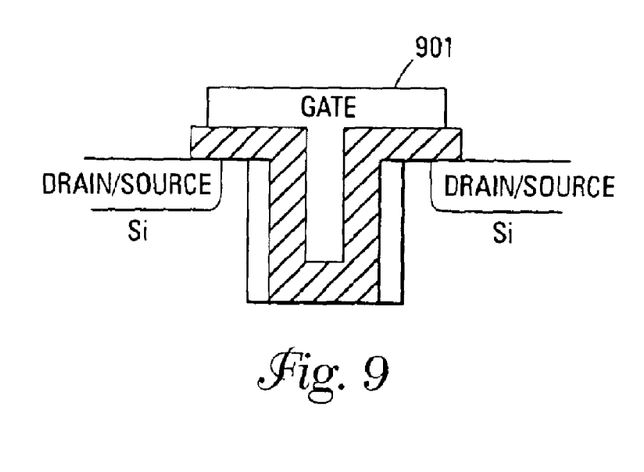
FIG. 9 shows an alternate embodiment gate configuration for the trench corner effect bidirectional flash memory cell of the present invention.

FIG. 9 illustrates an alternate embodiment gate configuration for the trench corner effect bidirectional flash memory cell of the present invention. In this embodiment, the gate 901 is formed such that it extends down into the trench in a "T" configuration.

Figure 10:
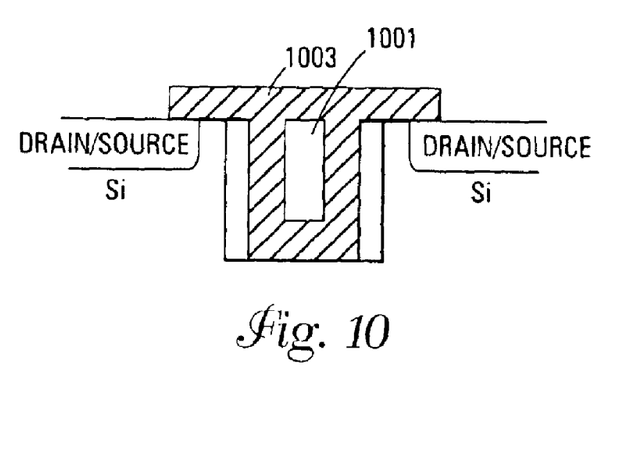
FIG. 10 shows another alternate embodiment gate configuration for the trench corner effect bidirectional flash memory cell of the present invention.

FIG. 10 illustrates another alternate embodiment gate configuration for the trench corner effect bidirectional flash memory cell of the present invention. In this embodiment, the gate 1001 is formed within the oxide dielectric material 1003.

Figure 11:
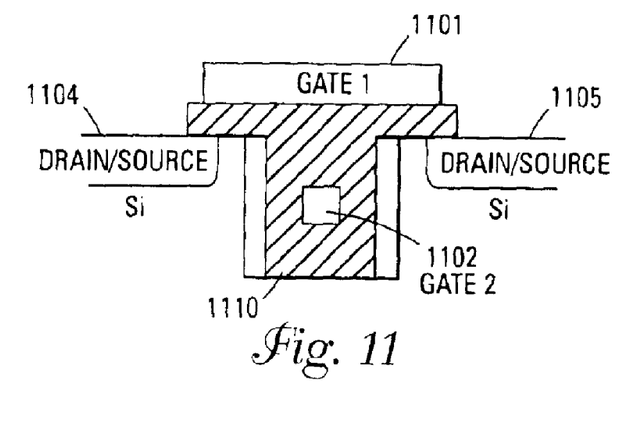
FIG. 11 shows yet another alternate embodiment gate configuration for the trench corner effect bidirectional flash memory cell of the present invention.

FIG. 11 illustrates yet another alternate embodiment gate configuration for the trench corner effect bidirectional flash memory cell of the present invention. In this embodiment, the gate 1101 and 1102 is formed in two parts. One part 1102 formed within the oxide dielectric material 1110 in the trench. The other part 1101 is formed over the trench and overlapping the two active areas 1104 and 1105.

In the embodiments of FIGS. 9–11 above, an oxide material is illustrated between the trapping material along the sidewalls of the trench and the portion of the control gate extending into the trench. This oxide is not required for proper operation of the present invention. The gate may be in contact with the trapping material.

CONCLUSION

In summary, the non-volatile memory cell architecture of the present invention uses a trench corner barrier effect to produce a compact cell containing two logical bits. The absence or presence of the energy barrier, in response to the absence or presence of trapped charges, creates the non-volatile memory states.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A trench corner effect, bidirectional flash memory cell comprising:
   a trench formed in a silicon substrate;
   at least a corner of a first and second side of the trench having a trapping material comprising an oxide-nitride-oxide architecture;
   an oxide material filling the trench;
   a plurality of active areas located in the silicon substrate substantially adjacent to the first and second sides; and
   a control gate above the trench.

2. The memory cell of claim 1 wherein the trapping material is deposited on the first and second sides of the trench.

3. The memory cell of claim 1 wherein the trapping material traps electrons.

4. The memory cell of claim 1 wherein the control gate overlaps at least a portion of each active area.

5. The memory cell of claim 1 wherein a first active area of the plurality of active areas is a drain area and a second active area is a source area.

6. A trench corner effect, bidirectional flash memory cell comprising:
   a trench formed in a silicon substrate;
   an oxide material filling the trench;
   a first and second side of the trench comprising a trapping material between the oxide material and the silicon substrate;
   a drain region located in the silicon substrate substantially adjacent to the first side of the trench near the trapping material;
   a source region located in the silicon substrate substantially adjacent to the second side of the trench near the trapping material; and
   a control gate over the trench such that the control gate and oxide material overlap at least a portion of the drain and source regions.

7. The memory cell of claim 6 wherein the substrate is comprised of a p-type conductive material and the drain and source regions are comprised of an n-type conductive material.

8. The memory cell of claim 6 wherein the substrate is comprised of an n-type conductive material and the drain and source regions are comprised of a p-type conductive material.

9. The memory cell of claim 6 wherein the trapping material on the first side stores a first data bit and the trapping material on the second side stores a second data bit.

10. A trench corner effect, bidirectional flash memory cell comprising:
    a trench formed in a silicon substrate;
    a low-trap-density dielectric material substantially filling the trench;
    a trapping material formed in a first and second corner of the trench between the dielectric material and the silicon substrate such that a first trapping area is formed in the first corner and a second trapping area is formed in the second corner;
    drain and source regions located in the silicon substrate, each region substantially adjacent to either the first or the second side; and
    a control gate formed over the trench such that the control gate and dielectric material overlap at least a portion of the drain and source regions.

11. The memory cell of claim 10 wherein direction of operation of the memory cell determines which side of the trench is adjacent to the drain region and which side is adjacent to the source region.

12. The memory cell of claim 10 wherein the trapping material is formed along the bottom of the trench between the first and second corners.

13. The memory cell of claim 12 wherein the thickness of the trapping layer formed along the bottom of the trench is such that the first and second trapping areas are isolated from each other.

14. The memory cell of claim 10 wherein the trapping material forms a continuous layer along the inside of the trench.

15. The memory cell of claim 10 wherein the cell is an n-channel device such that the first and second trapping areas are hole trapping areas.

16. The memory cell of claim 10 wherein the cell is a p-channel device such that the first and second trapping areas are electron trapping areas.

17. The memory cell of claim 10 wherein the trench extends into the silicon substrate at least as deep as the drain and source regions.

18. The memory cell of claim 10 wherein the trapping material is substantially confined to only the first and second corners of the trench.

19. The memory cell of claim 10 wherein the trapping material has an oxide-nitride-oxide structure.

* * * * *